United States Patent [19]

Obermann et al.

[11] Patent Number: 5,077,532

[45] Date of Patent: Dec. 31, 1991

[54] FEED FORWARD DISTORTION MINIMIZATION CIRCUIT

[75] Inventors: Mark G. Obermann, Niles; James F. Long, Glen Ellyn, both of Ill.

[73] Assignee: Motorola, Inc., Schaumburg, Ill.

[21] Appl. No.: 628,539

[22] Filed: Dec. 17, 1990

[51] Int. Cl.$^5$ .............................................. H03F 1/32
[52] U.S. Cl. .................................... 330/151; 330/149; 328/163
[58] Field of Search .......................... 330/151, 149, 52; 328/163

[56] References Cited

U.S. PATENT DOCUMENTS

| | | | |
|---|---|---|---|
| 3,815,040 | 6/1974 | Seidel | 330/149 |
| 3,922,617 | 11/1975 | Denniston et al. | 330/151 |
| 4,389,618 | 6/1983 | Bauman | 330/151 |
| 4,394,624 | 7/1983 | Bauman | 330/151 |
| 4,580,105 | 4/1986 | Myer | 330/149 |
| 4,879,519 | 11/1989 | Myer | 330/149 |
| 4,885,551 | 12/1989 | Myer | 330/52 |
| 4,943,783 | 7/1990 | Nojima | 330/151 |
| 4,987,378 | 1/1991 | Eggleston et al. | 330/149 |

Primary Examiner—Eugene R. LaRoche
Assistant Examiner—Tan Dinh
Attorney, Agent, or Firm—Val Jean F. Hillman

[57] ABSTRACT

A feed forward distortion minimization circuit which receives an input signal and routes the input signal along two signal paths is disclosed. One path, the main signal path, includes a distortion generator such as, for example, a power amplifier, which generates an output signal having a distortion component. The other path, the feed forward signal path, includes a delay line responsive to the input signal for feeding the input signal forward, without distortion. The output signal from the distortion generator is combined with a fed forward input signal to form an error signal representative of the distortion component. A feedback circuit is employed to detect a DC current or RF voltage proportional to the error signal's signal strength and to adjust the amplitude and the phase of signals in the feed forward or main signal paths to reduce the carrier to distortion ratio of the error signal. Thereafter, the error signal is subtracted from the main signal path to cancel any distortion components therein. The subtraction is controlled by circuitry which detects distortion at the main signal path output, and adjusts the amplitude and the phase of the error signal, so that when the error signal is subtracted from the main signal path, substantially all distortion is cancelled.

11 Claims, 6 Drawing Sheets

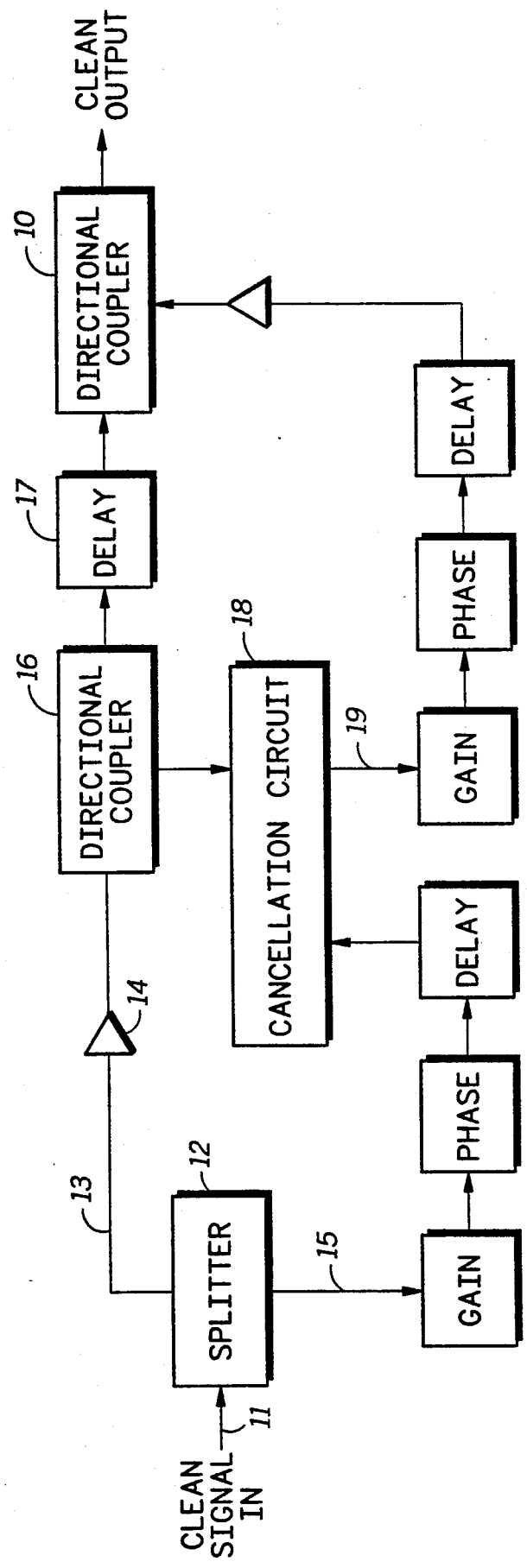
FIG.1A —PRIOR ART—

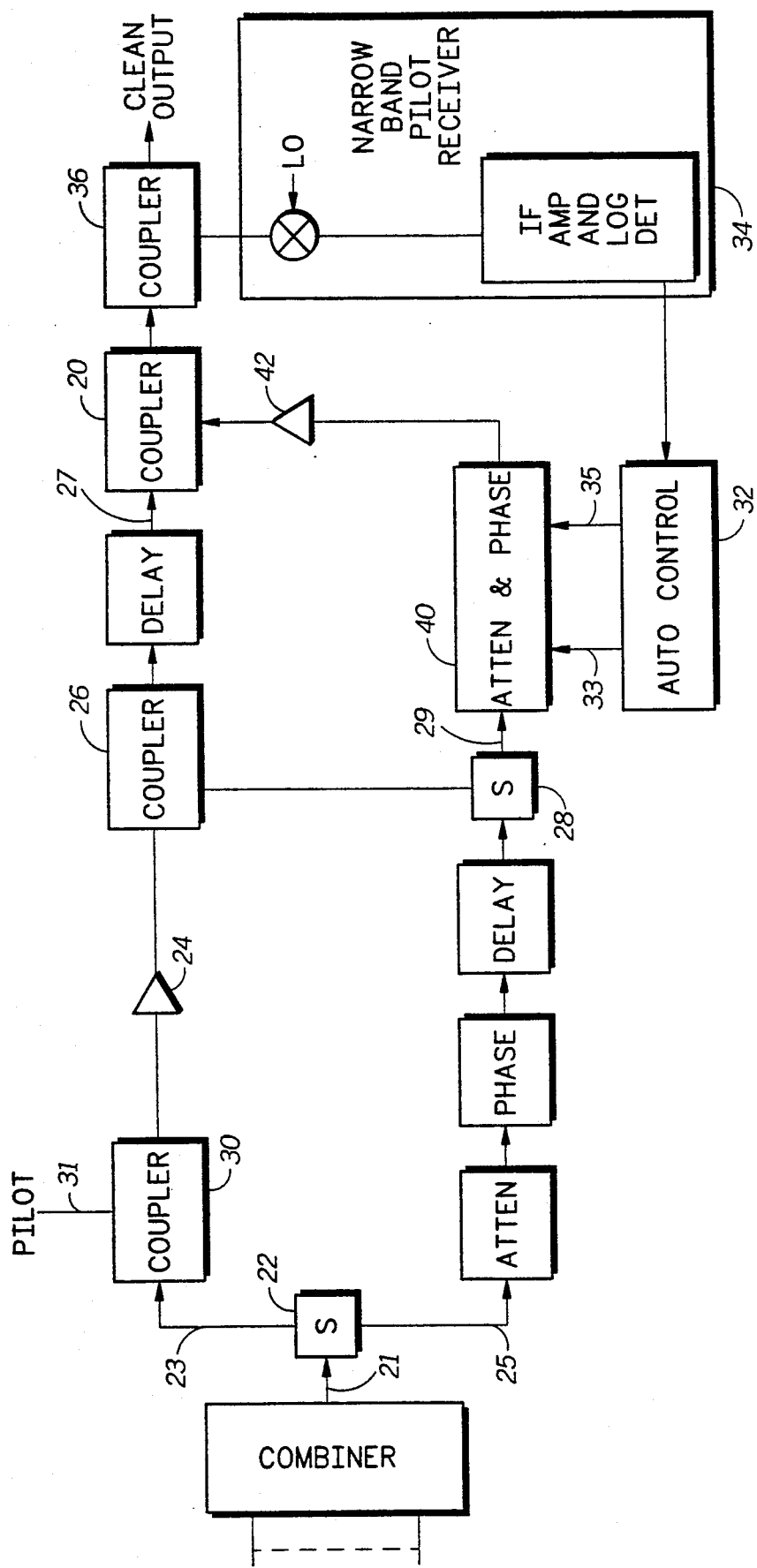
FIG.1B —PRIOR ART—

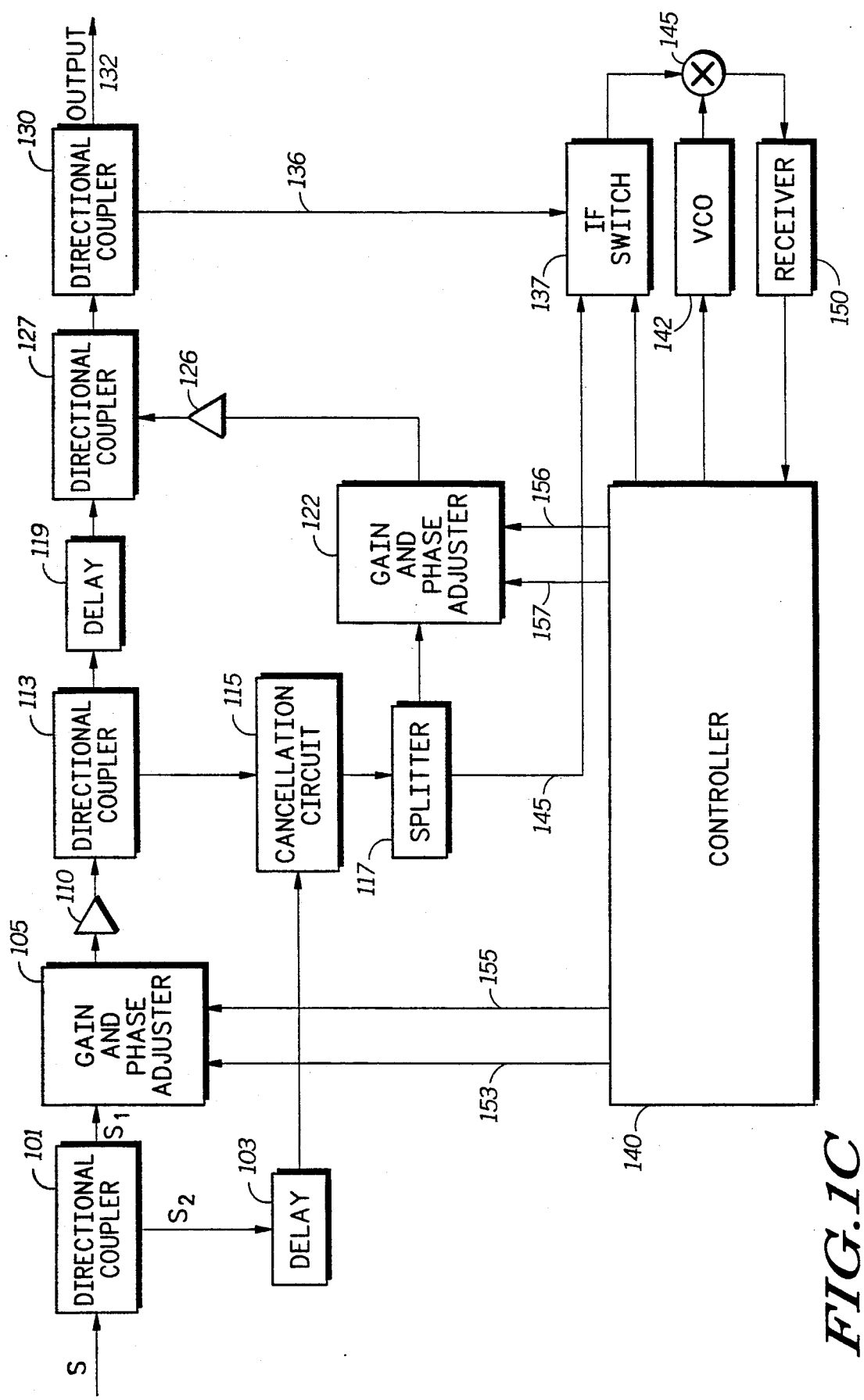
FIG.1C —PRIOR ART—

FEED FORWARD DISTORTION MINIMIZATION CIRCUIT

FIELD OF THE INVENTION

The present invention relates to feed forward distortion minimization circuits. More particularly, this invention relates to feed forward distortion minimization circuits and their application to radio frequency (RF) power amplifiers.

BACKGROUND OF THE INVENTION

RF power amplifiers are used in a wide variety of communications and other electronic applications. These amplifiers are made up of one or more cascaded amplifier stages, each of which increases the level of the signal applied to the input of that stage by an amount known as the stage gain. Ideally, the input to output transfer of each stage is linear; a perfect replica of the input signal increased in amplitude appears at the amplifier output. In reality, however, all RF power amplifiers have a degree of non-linearity in their transfer characteristic. This non-linearity results in the distortion of the output signal so that it is no longer a perfect replica of the input. This distortion produces spurious signal components known as intermodulation products. Intermodulation products are undesirable because they cause interference, cross talk, and other deleterious effects on the performance of a system employing RF power amplifiers. Accordingly, the prior art reflects various methods and devices designed to reduce the distortion produced during RF power amplifier operation. Two methods commonly suggested are predistortion and feed forward.

Predistortion utilizes an auxiliary distortion source that produces an auxiliary distortion signal similar to the distortion generated by a power amplifier. The auxiliary distortion signal is added to the power amplifier input in the correct gain and phase to promote cancellation of the distortion at the output of the power amplifier. This method requires matching the distortion characteristics of two dissimilar sources and hence limits the amount of correction which can be obtained.

The feed forward method does not have this limitation because it separates out that distortion generated by a power amplifier and adds it back into the power amplifier's output with gain, phase and delay adjusted for maximum cancellation. The amount of distortion reduction available using feed forward is limited only by the accuracy of the gain and phase adjustments and the correlation between the main amplifier and the error amplifier transfer functions.

Referring to FIG. 1A, there is shown a prior art feed forward system in block diagram form. Splitter circuit 12 divides the input signal on lead 11: one part is sent to power amplifier 14 and the other to cancellation circuit 18 via path 15. The output from power amplifier 14 includes a distortion component caused by the amplification of the input signal. A portion of the output signal from the power amplifier 14 is taken from directional coupler 16 and sent to cancellation circuit 18. The gain, phase and delay of the input signal on lead 15 is adjusted by fixed gain, phase and delay adjusters so that a portion of the input signal is cancelled when combined with the signal from directional coupler 16, to derive a distortion component on lead 19. The distortion component is adjusted by fixed gain, phase and delay adjusters, so that when the distortion component is combined with the power amplifier output, at directional coupler 10, the resultant output signal is free from distortion. The problem with this method, however, is the use of fixed gain, phase and delay adjuster which preclude the ability adjust gain and phase parameters in response to operating point changes, such as, for example, input signal variations, voltage variations, and temperature fluctuations.

Referring to FIG. 1B, there is shown yet another prior art feed forward system which attempts to overcome the above mentioned shortcomings. A test signal, or pilot, is injected, via coupler 30, into the main signal path of power amplifier 24. The magnitude of the pilot, when detected at the amplifier output, is used by automatic control circuit 32 to adjust the gain and phase of signals on lead 29 in order to eliminate both the pilot and the distortion introduced by the power amplifier 24. The problem with this approach is that the injected pilot signal occupies a portion of the system bandwidth that would otherwise be used by carriers, and therefore reduces the efficient use of system resources, which in turn adversely impacts system throughput. In addition, the embodiment in FIG. 1B still teaches the use of fixed gain, phase and delay adjuster to provide carrier cancellation.

Referring to FIG. 1C, there is shown yet another prior art feed forward system, designed to receive an input signal having at least one carrier signal therein in a prescribed frequency range. This input signal is applied to first and second circuit paths. The first circuit path has a power amplifier 110 that receives the input signal and produces an output signal with a distortion component. The second circuit path is designed to delay the input signal, without distortion. A portion of the signal from the first circuit path is combined with the delayed signal of the second circuit path to form a signal representative of the distortion generated by the power amplifier 110. Next, the signal representative of distortion is subtracted from the first circuit path output in order to cancel the distortion components therein.

In order to assure maximum distortion removal, a control circuit employing a narrow band scanning receiver scans the signal representative of distortion, over the prescribed frequency range, to locate carrier signals. Once a carrier signal is located, the magnitude of the detected carrier signal is supplied to controller 140 via narrow band receiver 150. Controller 140 then modifies the amplitude and phase parameters of amplitude and phase corrector 105 in order to drive the carrier component within the output of cancellation circuit 115 to a minimum. Thereafter, controller 140 scans the first circuit path output 132, over the prescribed frequency range, to detect intermodulation products. Once intermodulation products are found, the parameters of amplitude and phase adjuster 122 are modified by controller 140 to drive the intermodulation products appearing at the first circuit path output to a minimum.

The problem with this approach stems initially from its level of complexity. The process of scanning for frequencies representative of carrier signals or intermodulation products requires the use of highly selective scanning receiver circuitry which adds complexity and expense to feed forward error detection and correction circuitry. In addition to complexity, this approach suffers from an inherent inability to provide adequate carrier cancellation over a large system bandwidth, especially when two or more carriers are received simultaneously and require different phase and gain adjustments in order to be properly cancelled. Moreover, scanning techniques may be vulnerable to all types of correlated interference, such as, for example, co-channel interference and adjacent channel interference which may be mistaken for a desired signal and therefore cause the system to respond erroneously. This inherent weakness raises questions regarding scanning type feed forward correction circuits and their viability within an environment characterized by high levels of correlated interference.

It would be extremely advantageous therefore to provide a feed forward distortion minimization circuit that continuously, accurately and efficiently performs the gain and phase adjustments necessary to improve and maintain the intermodulation performance of a power amplifier, while avoiding the shortcomings of the prior art.

SUMMARY OF THE INVENTION

Briefly described the present invention is a feed forward distortion minimization circuit which receives an input signal and routes the input signal along two signal paths. One path, the main signal path, includes a distortion generator such as, for example, a power amplifier which generates an output signal having a distortion component. The other path, the feed forward signal path, is provided for transferring the input signal forward, without distortion. The output signal from the distortion generator is combined with the fed forward input signal, via combining circuitry, to form an error signal representative of the distortion component. Thereafter, a detector is employed to detect the entire carrier energy within the error signal. Next, feedback circuitry, responsive to the detected signal, adjusts the amplitude and the phase of signals within the feed forward or main signal paths to reduce the carrier to distortion ratio of the error signal.

According to one aspect of the invention the detector detects a DC current level proportional to the carrier energy within the error signal. According to another aspect of the invention, the detector detects a level of RF voltage. According to yet another aspect of the present invention, the disclosed feed forward circuit detects signals proportional to the entire intermodulation energy within an auxiliary error signal. In response thereto, the amplitude and the phase of the error signal is adjusted so that when the error signal is subtracted from the main signal path, substantially all distortion is cancelled.

It is a first advantage of the present invention that both carrier cancellation and intermodulation cancellation are controlled by the detection of the entire energy spectrum of an error signal, rather than by injected pilot or scanning receiver detection as in the prior art.

It is a second advantage of the invention that such detection permits precise cancellation regardless of the frequency, bandwidth, amplitude or number of carriers received.

BRIEF DESCRIPTION OF THE DRAWINGS

FIGS. 1A, 1B and 1C show feed forward distortion cancellation circuits according to the prior art;

DETAILED DESCRIPTION OF THE PREFERRED EMBODIMENT

Figure 2:
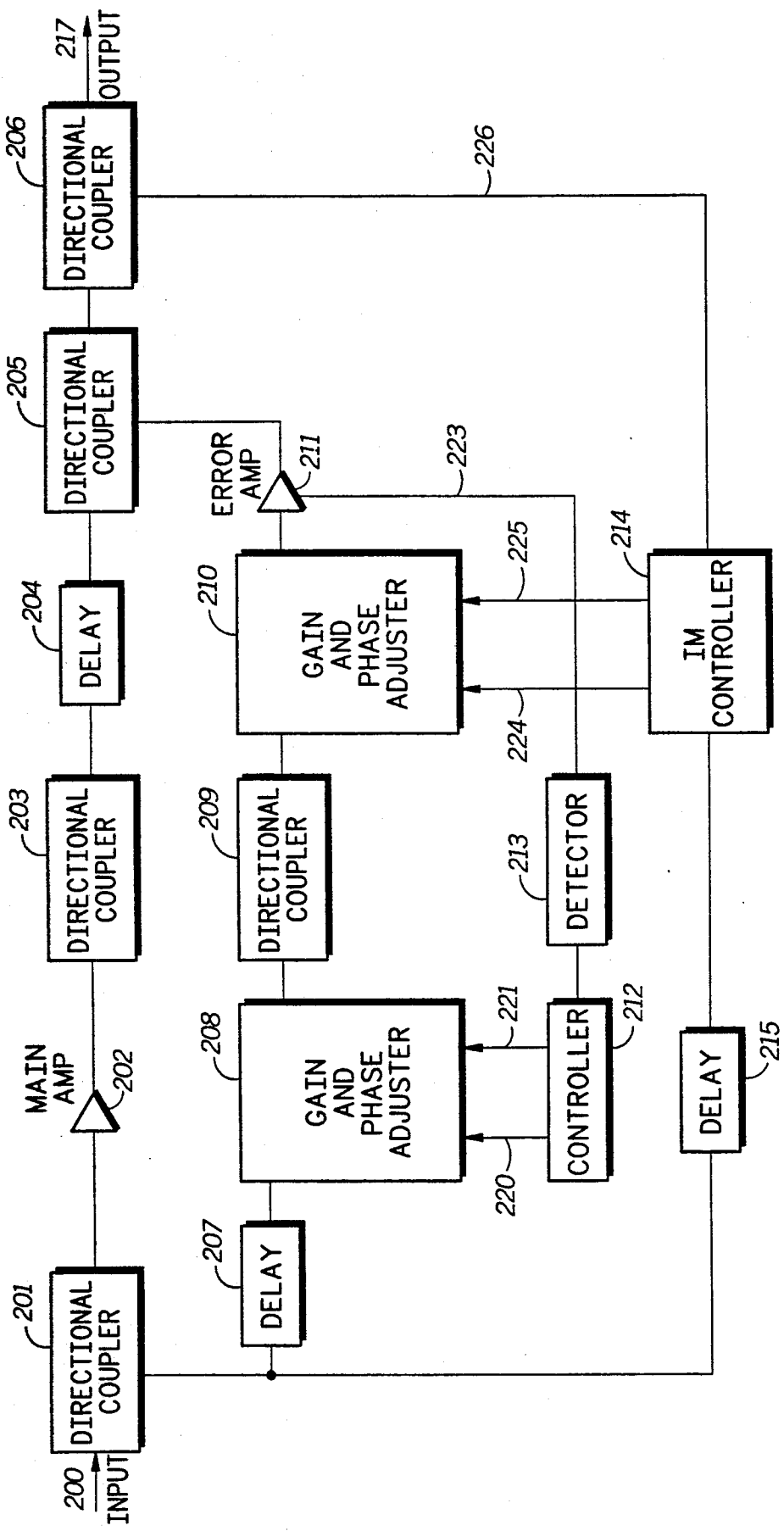
FIG. 2 shows a first embodiment of a feed forward minimization circuit according to the present invention.

Referring to FIG. 2, there is shown in block diagram form, a first embodiment of the feed forward minimization circuit according to the present invention. A composite input signal 200, which may comprise a plurality of RF carriers, is routed between two signal paths by directional coupler 201. In one signal path, the main signal path, the input signal is amplified in main amplifier 202 and directed to output 217 through directional coupler 203, delay 204 and directional couplers 205 and 206. As previously mentioned, distortion and intermodulation components may be introduced by main amplifier 202. Therefore, the circuit of FIG. 2 is designed to remove substantially all distortion and intermodulation prior to output 217.

In this effort, input signal 200 is delayed by delay circuit 207 of the feed forward signal path, then phase and gain adjusted by phase and gain adjuster 208 without any distortion being introduced. The time delay of delay 207 is set to compensate for the signal delay through main amp 202 and directional coupler 203. Next, directional couplers 203 and 209 permit a portion of the signal having a distortion component to be combined with the fed forward signal. If the amplitude and the phase of the fed forward input signal is properly adjusted, the carrier components of the amplified signal from directional coupler 203 will cancel the carrier components of the fed forward input signal, resulting in an error signal at the output of directional coupler 209, representative of the distortion component introduced by the main amplifier 202. This process is often referred to as carrier cancellation.

Thereafter, the amplitude and the phase of the error signal is modified in amplitude and phase adjuster 210, amplified in error amplifier 211 and routed to directional coupler 205 where it is subtracted from the output of the main amplifier via directional coupler 203 and delay 204. The time delay of delay 204 is set to compensate for the signal delay through directional coupler 209, gain and phase adjuster 210 and error amplifier 211. If the amplitude and the phase of the error signal is properly adjusted, the distortion component of the main signal path will be cancelled, resulting in a clean signal at the main signal path output 217.

In order to achieve maximum distortion removal, gain and phase adjuster 208 must first be controlled to produce a clean error signal, i.e. one that is substantially representative of the distortion created by main amplifier 202. In accordance with the present invention, a feedback circuit employing error amplifier 211, detector 213, controller 212 and gain and phase adjuster 208 is disclosed. This feedback circuit monitors the performance of carrier cancellation and provides dynamic control of gain and phase adjuster 208 to reduce the carrier to distortion ratio of the error signal, thereby assuring that the error signal substantially represent the distortion component introduced by main amplifier 202.

In operation, the amplified error signal on lead 223 is detected by detector 213. In one embodiment, detector 213 is a DC current detector that detects the DC current drawn by error amplifier 211. The current drawn by error amplifier 211 is a function of the amount of RF energy entering the error amplifier and is proportional to the total carrier energy within the error signal's passband. The greater the RF energy entering error amplifier 211, the larger the amount of current drawn by that amplifier during operation. When the detected DC current indicates sufficient carrier energy within the error signal, detector 213 provides an indication to controller 212. In response, controller 212 modifies the amplitude and phase parameters of gain and phase adjuster 208 via control lines 220 and 221, thereby adjusting the amplitude and the phase of signals in the feed forward signal path to improve carrier cancellation at the output of coupler 209. The detected DC current drawn by error amplifier 211 therefore provides valuable information for monitoring how well the present invention performs carrier cancellation, regardless of the frequency, bandwidth, amplitude or number of carriers received within input signal 200.

In another embodiment, detector 213 is an RF voltage detector that detects levels of RF voltage sampled from the output of error amplifier 211 across lead 223. The RF voltage on lead 223 is proportional to the carrier energy within the error signal's passband. When the RF voltage sampled on lead 223 is sufficiently high, detector 213 provides an indication to controller 212. In response, controller 212 will modify the amplitude and phase parameters of gain and phase adjuster 208 via control lines 220 and 221, thereby adjusting the amplitude and phase of signals in the feed forward or main signal paths to reduce the carrier to distortion component of the error signal. As previously discussed, the amplitude and phase adjustment assures that the present invention provides a substantially clean error signal. It is also necessary, however, to guarantee proper cancellation of any intermodulation (IM) components at the main signal path output.

According to the present invention an intermodulation cancellation circuit employing error amplifier 211, directional couplers 205 and 206, IM controller 214 and gain and phase adjuster 210 is disclosed. This circuit is designed to provide maximum distortion cancellation by monitoring the intermodulation performance of the feed forward circuit and providing dynamic control of gain and phase adjuster 210 in response thereto.

In operation, the amplitude and the phase of the error signal is modified in gain and phase adjuster 210, amplified by error amp 211 and routed to directional coupler 205 where it is subtracted from the output of the main amplifier via directional coupler 205 to remove all distortion from the main signal path. To assure maximum distortion cancellation, a portion of the main amplifier output signal is taken from directional coupler 206 and routed to IM controller 214. A portion of the input signal 200 is delayed by delay circuit 215, then routed to IM controller 214. If the amplitude and the phase of the error signal is properly adjusted the IM controller will detect no distortion on lead 226. Assuming lead 226 has distortion components of sufficient energy, however, the IM controller 214 will modify the amplitude and phase parameters of gain and phase adjuster 210, via control lines 224 and 225, thereby adjusting the amplitude and the phase of the error signal to drive the distortion on lead 226 to a minimum. Of note, the feed forward circuit disclosed in FIG. 2 provides distortion minimization without the use of inefficient pilot tone signals, and without the added expensive and complexity associated with prior art scanning receiver arrangements.

Figure 3:
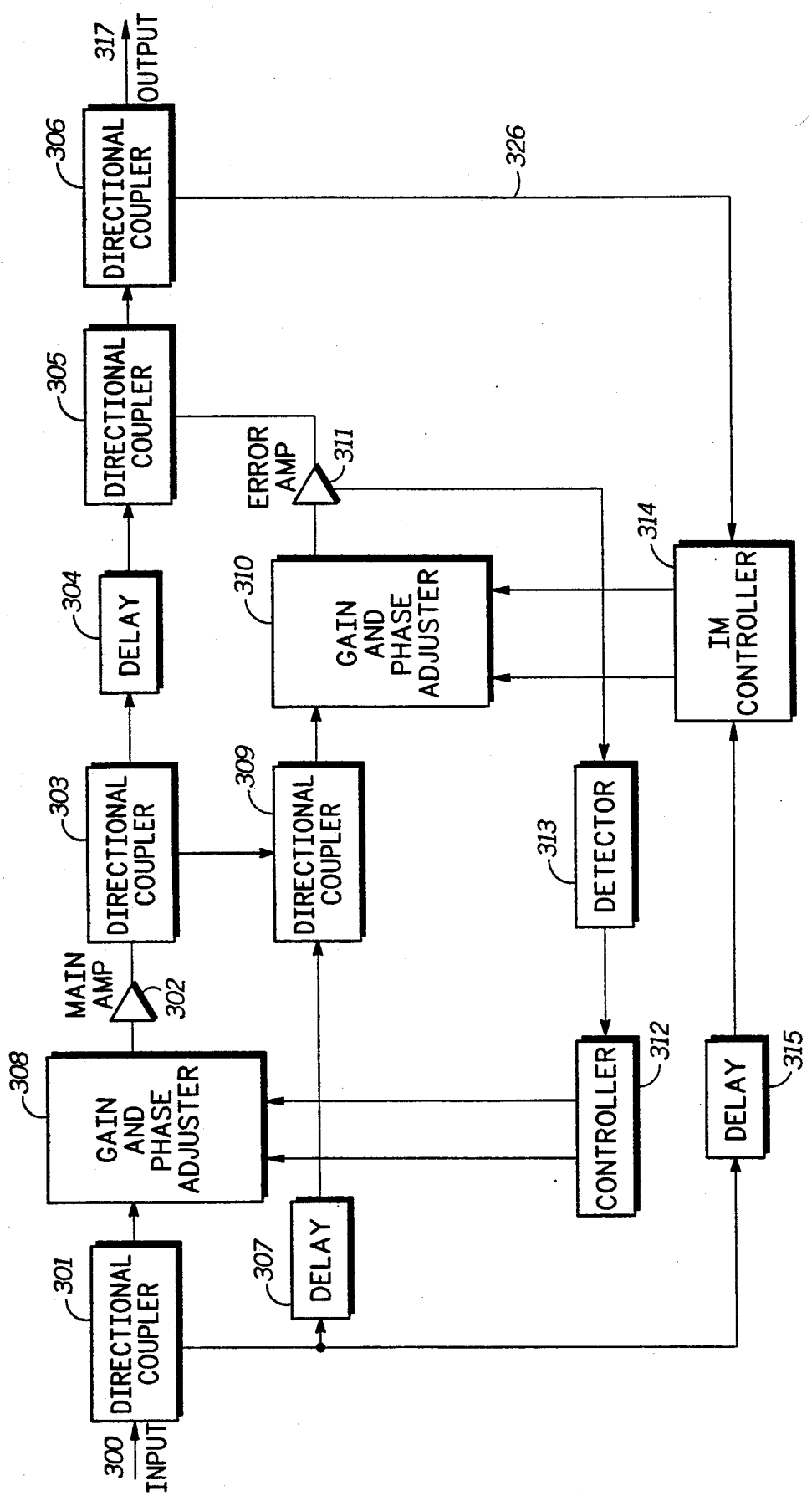
FIG. 3 shows a second embodiment of a feed forward minimization circuit according to the present invention.

Referring to FIG. 3, a block diagram of an alternative embodiment of the present feed forward 1 minimization circuit is shown. According to FIG. 3, the main signal path includes directional coupler 301, gain and phase adjuster 308, main amp 302, directional coupler 303, delay 304 and directional couplers 305 and 306 which operate in accordance with the description of FIG. 2. One exception, the disclosed feedback circuit of FIG. 3 includes gain and phase adjuster 308 which provides dynamic control of signals in the main signal path in order to adjust carrier cancellation performance. It will be appreciated by those skilled in the art, however, that the modified feedback circuit disclosed in FIG. 3 still operates to monitor carrier cancellation by the detection of the entire carrier energy within an error signal.

The feed forward signal path of FIG. 3 includes delay 307, directional coupler 309, gain and phase adjuster 310 and error amplifier 311. The feed forward signal path of FIG. 3 operate as described with respect to FIG. 2, except the gain and phase adjustment associated with carrier cancellation occurs in the main as opposed to the feed forward signal path.

IM controller 314 of FIG. 3 is identical to the IM controller 214 of FIG. 2. It will be appreciated by those skilled in the art, therefore, that the following discussion on the IM controller has equal applicability to FIGS. 2 and 3.

Figure 4:
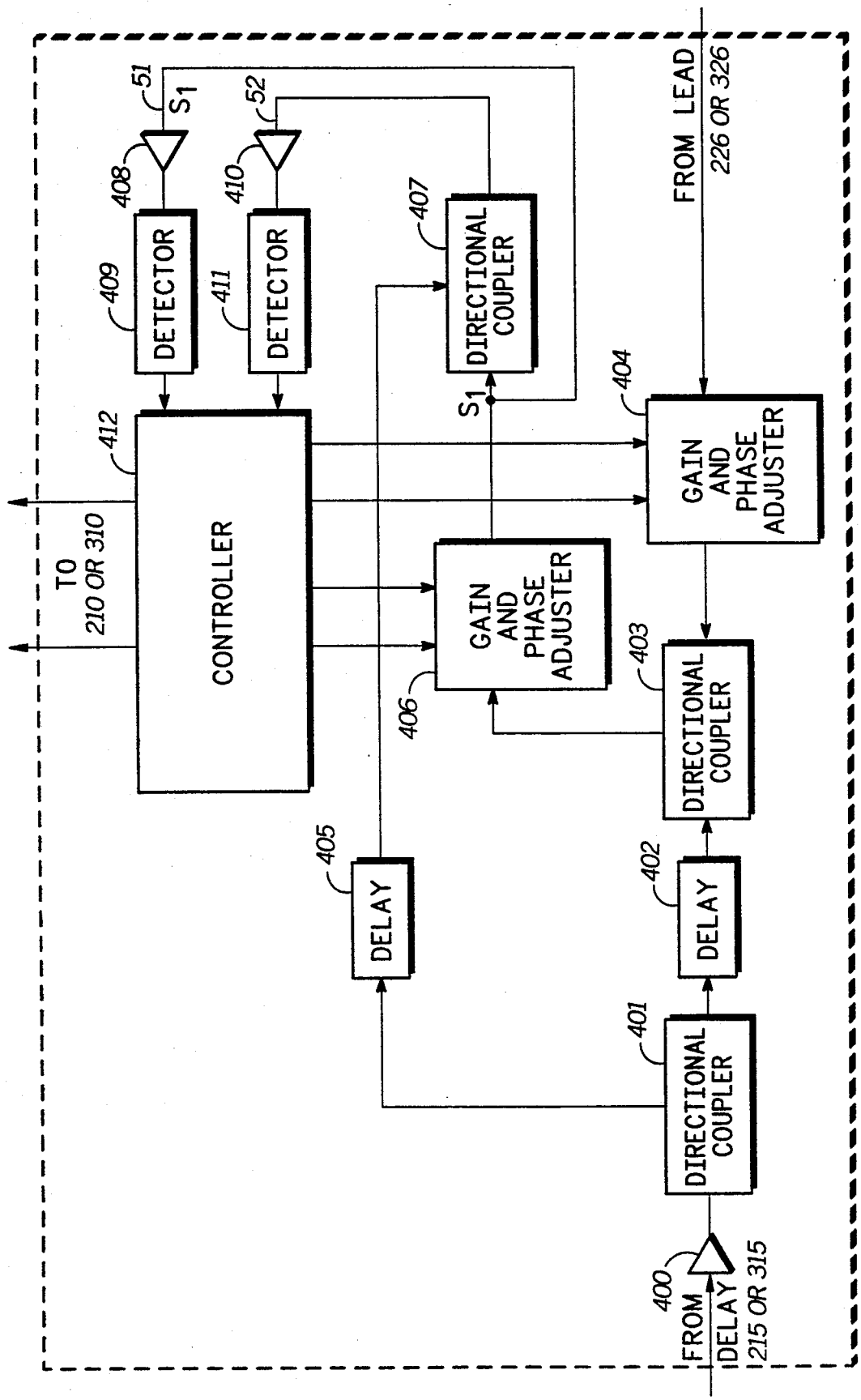
FIG. 4 shows a detailed block diagram of the IM controller shown in FIG. 2 and FIG. 3.

FIG. 4 depicts a detailed block diagram of the IM controller of FIGS. 2 and 3. In operation, the IM controller receives an input from delay line 215 or 315 This delayed input signal is amplified by amplifier 400 and routed to directional coupler 401. At the same time the IM controller receives an input from the main signal path output at lead 226 or 326. This signal is gain and phase adjusted by gain and phase adjuster 404 and then combined with the amplified input signal via delay 402 and directional coupler 403 in order to perform a first carrier component cancellation. The resultant auxiliary error signal is gain and phase adjusted by gain and phase adjuster 406. Thereafter, the auxiliary error signal S1 is routed to directional coupler 407 where it is combined with a portion of the amplified input signal taken from directional coupler 401 and delayed by delay circuit 405. The combination of signals at directional coupler 407 represents a second or cascaded carrier cancellation loop.

In most cases after one carrier cancellation operation, the carrier energy in the auxiliary error signal spectrum still overpowers the intermodulation product signal energy. Therefore, to fully isolate the intermodulation products from the carrier signals, a second carrier cancellation operation is performed which reduces the carrier signal energy to at least the level of the intermodulation product energy.

The output from directional coupler 407 is designated S2. S2 is an auxiliary error signal substantially representative of the distortion energy at the main signal path output and should not be confused with the error signal generated in the feed forward signal path of the present invention. S2 is used by controller 412 to control gain and phase adjuster 406 of the the second cancellation loop.

In operation, auxiliary error amplifier 410 raises the signal level of S2 prior to its detection by detector 411. In the preferred embodiment detector 411 is a diode detector, such as, for example, a simple Schottky type diode detector which provides a DC voltage in response to the amplified signal from auxiliary error amplifier 411. In practice detector 411 may be any detector which detects a signal proportional to S2's signal strength, such as, for example amplifying detectors, DC current detectors and RF voltage detectors. Upon the detection of auxiliary error signal S2, detector 411 provides controller 412 with an indication of an amount of RF energy detected. Since this RF energy is an undesired component of signal S2, controller 412 is programmed to further adjust the gain and phase parameters of gain and phase adjuster 406 to reduce the carrier to distortion ratio of the auxiliary error signal from the first cancellation loop. Of importance, controller 412 utilizes the detector 411 output to adjust the gain and phase parameters of gain and phase adjusters 210 and 310 according to FIGS. 2 and 3, thereby adjusting the amplitude and the phase of the error signal to drive the intermodulation products on leads 226 or 326 to a minimum.

In a similar fashion error signal S1 in conjunction with auxiliary error amplifier 408, detector 409 and controller 412 operate to control the gain and phase parameters of gain and phase adjuster 404 to assure maximum carrier cancellation during the first carrier cancellation loop. Accordingly, the primary purpose of the IM controller depicted in FIGS. 2, 3 and 4 is to properly isolate the intermodulation products (distortion) within the main signal path output in order to optimize the intermodulation performance of the disclosed feed forward minimization circuit.

The invention has been described with reference to illustrative embodiments thereof. It will be apparent to one skilled in the art, however, that various modifications and changes can be made without departing from the spirit and scope of the invention. For example, FIGS. 2 and 3 depict circuits wherein a single carrier cancellation loop is employed. It will be appreciated by those skilled in the art that nested or cascaded carrier cancellation loops, like those disclosed at FIG. 4, are an obvious modification to the depicted embodiments. In a similar fashion, the cascaded carrier cancellation circuit disclosed in FIG. 4 is easily converted to a single loop configuration.

What is claimed is:

1. A feed forward distortion minimization circuit comprising:
    means, for receiving an input signal;
    a main signal path having an input connected to the receiving means and a distortion generating means responsive to the input signal for generating an output signal having a distortion component;
    a feed forward signal path having an input connected to the receiving means for feeding the input signal forward, without distortion;
    means, for combining the distortion generating means output signal with a fed forward input signal to form an error signal substantially representative of the distortion component;
    detecting means, operably coupled to the combining means, for detecting a DC current proportional to the entire carrier energy within the error signal; and
    feedback circuit means, responsive to the detected signal, for adjusting the amplitude and the phase of signals in at least one signal path, to reduce the carrier to distortion ratio of the error signal.

2. The feed forward minimization circuit according to claim 1 wherein the detecting means detects an RF voltage proportional to the carrier energy component of the error signal.

3. The feed forward minimization circuit according to claim 1 wherein the feedback circuit means comprises at least the detecting means, a control circuit means responsive to the detecting means and a phase and gain adjuster, responsive to the control circuit means, for adjusting the amplitude and the phase of signals in at least one signal path.

4. The feed forward minimization circuit according to claim 1 further comprising:
    circuit means, responsive to detection of a signal proportional to the entire distortion energy within the main signal path output, for adjusting the amplitude and the phase of the error signal, so that when the error signal is subtracted from the main signal path, substantially all distortion is cancelled.

5. The feed forward minimization circuit according to claim 4 wherein the circuit means further comprises:
    means for detecting a signal proportional to the entire distortion energy within the main signal path output.

6. A feed forward amplifier having a distortion minimization circuit comprising:
    means, for receiving an input signal;
    a main signal path having an input connected to the receiving means and a distortion generating means responsive to the input signal for generating an output signal having a distortion component;
    a feed forward signal path having an input connected to the receiving means for feeding the input signal forward, without distortion;
    means, for combining the distortion generating means output signal with a fed forward input signal to form an error signal substantially representative of the distortion component;
    detecting means, operably coupled to the combining means, for detecting a RF voltage proportional to the entire carrier energy within the error signal without scanning a prescribed frequency range for a carrier signal;
    feedback circuit means, responsive to the detected signal, for adjusting the amplitude and the phase of signals in at least one signal path, to reduce the carrier to distortion ratio of the error signal; and
    circuit means, responsive to distortion detected at the main signal path output, for adjusting the amplitude and the phase of the error signal, so that when the error signal is subtracted from the main signal path, substantially all distortion is cancelled.

7. The feed forward amplifier according to claim 6 wherein the detecting means detects a DC current proportional to the carrier energy within the error signal.

8. The feed forward amplifier according to claim 6 wherein the feedback circuit means comprises at least the detecting means, a control circuit responsive to the detecting means for providing control signals, and a phase and a gain adjuster, responsive to the control signals, for adjusting the amplitude and the phase of signals in at least one signal path.

9. The feed forward amplifier according to claim 6 wherein the circuit means further comprises:
    means for detecting an auxiliary error signal proportional to the entire distortion energy within the main signal path output; and
    means responsive to the detected auxiliary error signal for adjusting the amplitude and the phase of the error signal.

10. A method of minimizing the distortion produced by a power amplifier comprising the steps of:

receiving an input signal;

providing a main signal path having an input for receiving the input signal and a power amplifier responsive to the input signal for generating an output signal having a distortion component;

providing a feed forward signal path having an input for receiving the input signal and for feeding the input signal forward, without distortion, combining the power amplifier output signal with a fed forward input signal to form an error signal substantially representative of the distortion component;

detecting a DC current proportional to the entire carrier energy within the error signal;

adjusting the amplitude and the phase of signals in at least one signal path in response to carrier energy detection to reduce the carrier to distortion ratio of the error signal;

detecting a DC current proportional to the entire distortion energy within the main signal path output; and adjusting the amplitude and the phase of the error signal, in response to distortion detection, so that substantially all distortion is cancelled when the error signal is subtracted from the main signal.

11. The method of claim 10 wherein the steps of detecting a signal proportional to the entire carrier energy within the error signal and detecting a signal proportional to the entire distortion energy within the main signal path output include detecting an RF voltage level.

* * * * *